(12) United States Patent
Ohashi et al.

(10) Patent No.: US 7,488,369 B2
(45) Date of Patent: Feb. 10, 2009

(54) MAGNETOSTRICTION DEVICE

(75) Inventors: Yoshio Ohashi, Kanagawa (JP); Masaru Uryu, Chiba (JP)

(73) Assignee: Sony Corporation (JP)

( * ) Notice: Subject to any disclaimer, the term of this patent is extended or adjusted under 35 U.S.C. 154(b) by 270 days.

(21) Appl. No.: 11/443,403

(22) Filed: May 30, 2006

(65) Prior Publication Data

US 2006/0213325 A1 Sep. 28, 2006

Related U.S. Application Data

(63) Continuation of application No. 10/964,934, filed on Oct. 14, 2004, now abandoned.

(30) Foreign Application Priority Data

Oct. 29, 2003 (JP) ............................ P2003-369396

(51) Int. Cl.
*B22F 3/00* (2006.01)
(52) U.S. Cl. ..................... 75/246; 148/306; 335/215; 310/26; 310/45
(58) Field of Classification Search .................. 419/27; 75/246; 310/26, 45; 335/215; 148/100, 148/306

See application file for complete search history.

(56) References Cited

U.S. PATENT DOCUMENTS

| 2,490,273 | A | 12/1949 | Kean |
| 3,346,841 | A | 10/1967 | Weichart |
| 4,152,178 | A | 5/1979 | Malekzadeh et al. |
| 5,357,232 | A | 10/1994 | Suzuki et al. |
| 5,529,745 | A | 6/1996 | Mori et al. |
| 5,628,569 | A | 5/1997 | Hayakawa et al. |
| 5,792,284 | A | 8/1998 | Cedell et al. |
| 2003/0190250 | A1 | 10/2003 | Mori et al. |

FOREIGN PATENT DOCUMENTS

| EP | 1 035 593 | 9/2000 |
| JP | 08-264855 A | 10/1996 |
| WO | 03/032337 | 4/2003 |

OTHER PUBLICATIONS

Low, I, et al, "Mechanical and Fracture Properties of Epoxy-Modified YBACUO (123) Superconductors", Journal of Materials Science Letters, Chapman and Hall Ltd., London GB, vol. 13, No. 18, pp. 1340-1342, Sep. 15, 1994.

Nan, Ce-Wen, et al., "Effect of porosity on the effective magnetostriction of polycrystals", Journal of Applied Physics, American Institute of Physics, NY, vol. 88, No. 1, pp. 339-343, Jul. 1, 2000.

*Primary Examiner*—Roy King
*Assistant Examiner*—Ngoclan T Mai
(74) *Attorney, Agent, or Firm*—Lerner, David, Littenberg, Krumholz & Mentlik, LLP

(57) ABSTRACT

A magnetostriction device is made such that an impregnated composition material, such as phenol resin, a resin in which an inorganic material such as silica is dispersed into a phenol resin, an epoxy based resin, or an acrylic resin is impregnated and caked into holes of a magnetostrictive sintered material manufactured by a powder metallurgy method. This magnetostriction device has improved mechanical strength against external force.

10 Claims, 2 Drawing Sheets

MAGNETOSTRICTION DEVICE

CROSS-REFERENCE TO RELATED APPLICATIONS

The present application claims priority from Japanese Patent Application No. JP 2003-369396 filed on Oct. 29, 2003, and is a continuation of U.S. application Ser. No. 10/964,934, filed on Oct. 14, 2004, the disclosure of which is hereby incorporated by reference herein.

BACKGROUND OF THE INVENTION

The present invention relates to a magnetostriction device for use with a magneto-machine transducer device such as a magnetostriction actuator and a magnetostriction piezoelectric transducer.

The magnetostriction device using magnetostrictive sintered material manufactured by the powder metallurgy method has a small volume density of approximately 80% as compared with a magnetostriction device manufactured by a single crystal method or a unidirectional solidification method. The reason for this is that this magnetostrictive sintered material has holes formed thereon and that these holes occupy approximately 20% of the whole volume of the magnetostrictive sintered material.

Therefore, the magnetostriction device using this magnetostrictive sintered material has a magnetic permeability smaller than that of the magnetostriction device manufactured by the single crystal method or the unidirectional solidification method. Furthermore, the above magnetostriction device using this magnetostrictive sintered material encounters a disadvantage that it is weak against external force such as when it is easily broken with application of pre-stress.

SUMMARY OF THE INVENTION

In view of the aforesaid aspect, it is an object of the present invention to provide a magnetostriction device in which mechanical strength against external force can be improved.

It is another object of the present invention to provide a magnetostriction device in which a magnetic permeability can be improved.

According to an aspect of the present invention, there is provided a magnetostriction device in which an impregnated composition material is impregnated into and caked into holes of a magnetostrictive sintered material manufactured by a powder metallurgy method.

According to another aspect of the present invention, there is provided a magnetostriction device in which a magnetostrictive sintered material of $Tb_{0.3}Dy_{0.7}Fe_2$ is made of powder ground from $Fe_2Tb$, $Fe_2Dy$ by a powder metallurgy method, an impregnated composition material being impregnated and caked into holes of the magnetostrictive sintered material.

According to a further aspect of the present invention, there is provided a magnetostriction device, wherein the impregnated composition material is phenol resin or resin in which an inorganic material such as silica is dispersed into phenol resin, epoxy based resin or acrylic resin.

In accordance with yet a further aspect of the present invention, there is provided a magnetostriction device, wherein the impregnated composition material has a powder-like material with a high magnetic permeability dispersed thereto.

According to the present invention, since the impregnated composition material is impregnated into the holes of the magnetostrictive sintered material, it is possible to improve the mechanical strength of this magnetostriction device.

Also, the magnetostriction device according to the present invention has the powder-like material with the high magnetic permeability dispersed into the above-mentioned impregnated composition material.

Further, according to the present invention, since the impregnated composition material in which the powder-like material with the high magnetic permeability is dispersed is impregnated and caked into the holes of the magnetostrictive sintered material, the mechanical strength of this magnetostriction device can be improved and the magnetic permeability thereof also can be improved.

Furthermore, according to the present invention, the mechanical strength of the magnetostriction device manufactured by the powder metallurgy method can be improved and the magnetic permeability thereof also can be improved.

DETAILED DESCRIPTION

A magnetostriction device according to the embodiments of the present invention will be described with reference to the drawings.

In this embodiment, first, a magnetostrictive sintered material having a predetermined shape is formed by a powder metallurgy method similar to the related art. More specifically, $Fe_2Tb$, $Fe_2Dy$ are ground in the atmosphere of Ar gas to produce powder of a particle size of approximately 10 μmesh as a binary alloy of a rare earth-3d element having a large magnetic anisotropy.

Next, after the above powder was mixed well, the resulting product is processed by a magnetic press treatment under a magnetic field ranging from 10 to 15 kOe and thereby a pressed powder molded material having a predetermined shape is manufactured. In this case, it is possible to manufacture a pressed powder molded material having an arbitrary shape.

Further, this pressed powder molded material is temporarily sintered in the atmosphere of Ar gas with pressure of 1.1 at a temperature ranging from 1200° C. to 1250° C. for 30 minutes. After that, the resultant product was sintered at a temperature ranging from 900° C. to 1100° C. for 200 hours and thereby a magnetostrictive sintered material 10 having a predetermined shape shown in FIG. 1 was manufactured.

Figure 2:
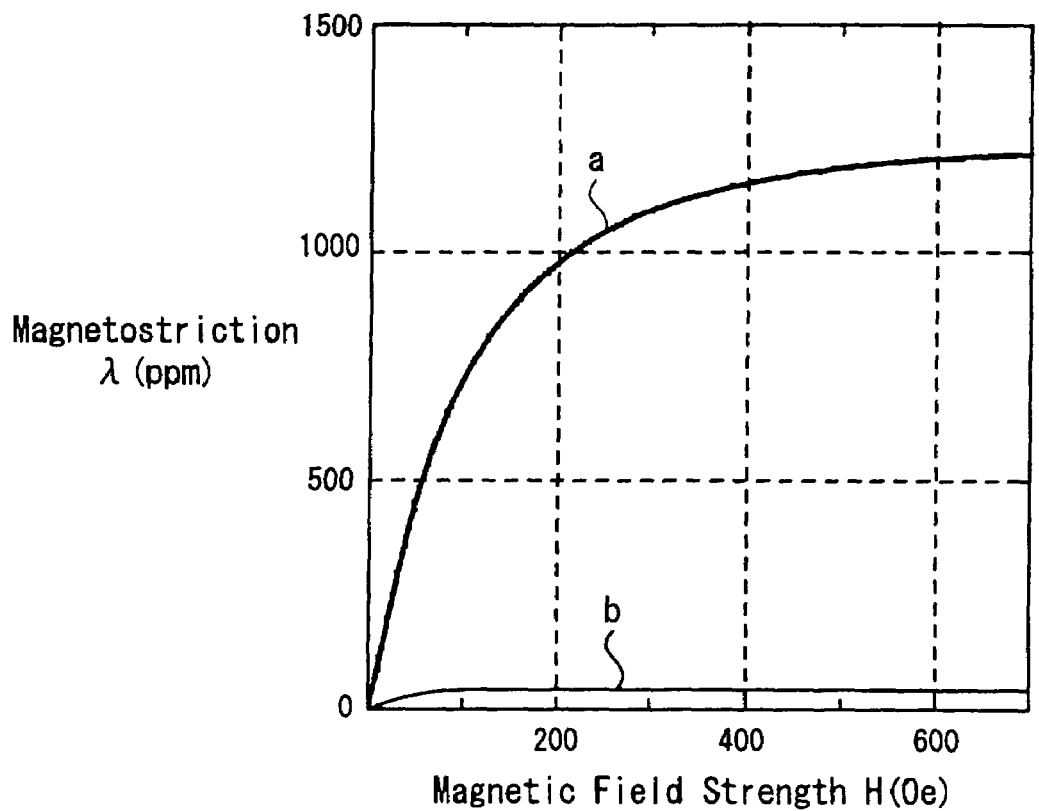
FIG. 2 is a diagram showing examples of characteristic curves indicating measured results of magnetostrictive properties of a magnetostriction device.
Figure 3:
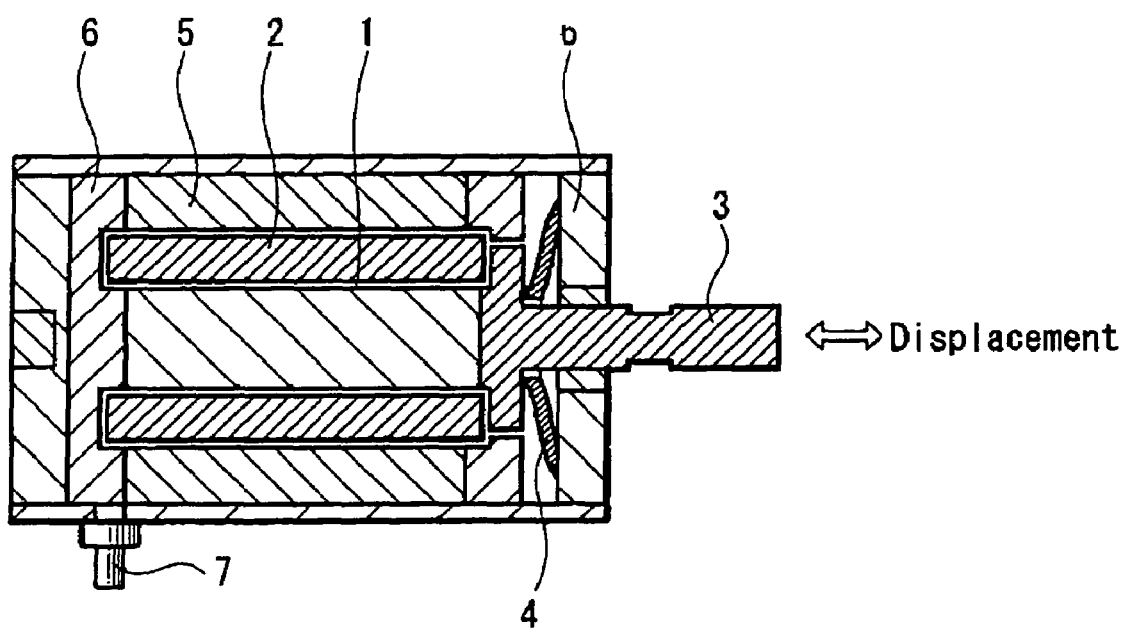
FIG. 3 is a schematic cross-sectional view showing an example of an actuator using a magnetostriction device.

The resultant magnetostrictive sintered material 10 is a $Tb_{0.3}Dy_{0.7}Fe_2$ alloy and magnetic properties of 1.2 ppm were obtained under the magnetic field less than 1 kOe as shown by the curve a in FIG. 2.

Figure 1:
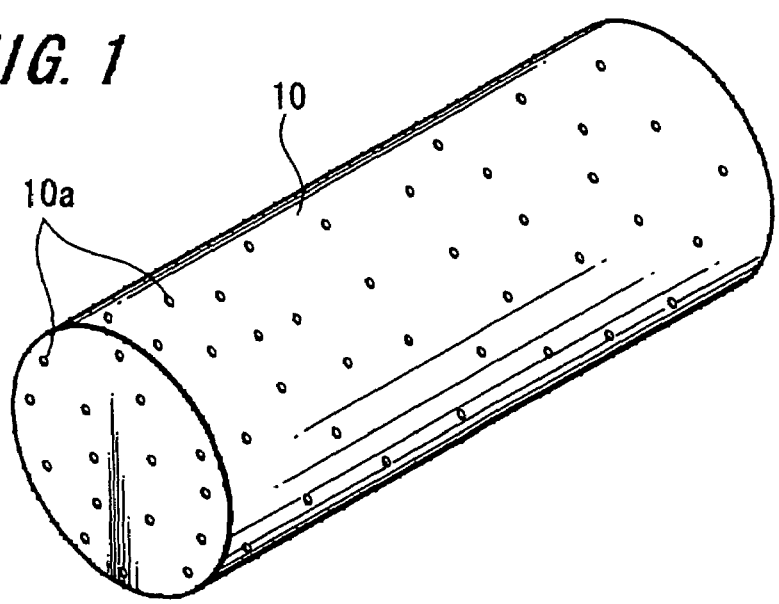
FIG. 1 is a perspective view showing a magnetostriction device according to an embodiment of the present invention.

According to the embodiment of the present invention, it is possible to manufacture the magnetostrictive sintered material 10 with the arbitrary shape and the high magnetic properties at a relatively low manufacturing cost. The magnetostrictive sintered material 10 manufactured by this powder metallurgy method has innumerable extremely small holes 10a as shown in FIG. 1.

In this embodiment, this magnetostrictive sintered material 10 was processed by the following treatment.

INVENTIVE EXAMPLE 1

The impregnated composition material was impregnated into this magnetostrictive sintered material 10 and cured by using impregnation phenol resin (manufactured by Sumitomo Bakelite Company Limited under the trade name of "PR-9183B") as the impregnated composition material as follows.

First, the magnetostrictive sintered material 10 is rinsed in a pre-treatment process. After that, this magnetostrictive sintered material 10 is set within a tank and this tank is evacuated to let air out of the holes 10a of the magnetostrictive sintered material 10. After that, the impregnation phenol resin that is the impregnated composition material is injected into this tank and the magnetostrictive sintered material 10 is dipped into this impregnation phenol resin.

After that, the impregnation phenol resin is impregnated into the holes 10a of the magnetostrictive sintered material 10 by returning the tank to the atmospheric pressure.

Next, the magnetostrictive sintered material 10 is taken out of the tank and extra impregnation phenol resin is removed from the surface of the magnetostrictive sintered material 10 by rinsing. Thereafter, the resultant product is dried at 150° C. in the air and impregnation phenol resin in the holes 10a is cured. Thus, the impregnation and curing treatment is completed.

When flexural strength of the magnetostriction device in which impregnation phenol resin was impregnated and cured into the holes 10a of the magnetostrictive sintered material 10 was measured by a three-point flexural measurement method, the flexural strength of this magnetostriction device was about 28 MPa, and it could be confirmed that the flexural strength of the magnetostriction device according to the present invention is large as compared with flexural strength of 23.4 MPa of a magnetostriction device made of a magnetostrictive sintered material in which the impregnation phenol resin is not impregnated and cured into the holes 10a.

INVENTIVE EXAMPLE 2

Impregnation phenol resin (manufactured by Sumitomo Bakelite Company Limited under the trade name of "PR-9183B") is used as an impregnated composition material, and powder (particle size thereof lies in a range of from 5 to 20 microns) of iron (that is, iron equivalent to S15C), which is a ferromagnetic material, is dispersed into this impregnation phenol resin with a weight ratio of "5" of impregnation phenol resin to "1" of iron powder. This mixed impregnation phenol resin product is impregnated and cured into the holes 10a of the magnetostrictive sintered material 10 as follows.

First, the magnetostrictive sintered material 10 is rinsed in the pre-treatment process. After that, the magnetostrictive sintered material 10 is set in a tank and the tank is evacuated to let air out of the holes 10a of the magnetostrictive sintered material 10. After that, the impregnation phenol resin in which the powder of the ferromagnetic material was dispersed is injected into the tank and the magnetostrictive sintered material 10 is dipped into the impregnation phenol resin into which the powder of the ferromagnetic material was dispersed.

After that, the impregnation phenol resin in which the powder of the ferromagnetic material was dispersed is impregnated into the holes 10a of the magnetostrictive sintered material 10 by returning the tank to the atmospheric pressure.

Next, the magnetostrictive sintered material 10 is taken out of the tank and extra impregnation phenol resin in which the powder of the ferromagnetic material was dispersed is removed from the surface of the magnetostrictive sintered material 10 by rinsing. Thereafter, the resultant product is dried at 150° C. in the air and the impregnation phenol resin in which the powder of the ferromagnetic material was dispersed in the holes 10a is cured. Thus, the impregnation and curing treatment is completed.

When flexural strength of the magnetostriction device in which impregnation phenol resin in which the powder of the ferromagnetic material was dispersed was impregnated and cured into the holes 10a of the magnetostrictive sintered material 10 was measured by a three-point flexural measurement method, the flexural strength of this magnetostriction device was about 30 MPa, and it could be confirmed that the flexural strength of the magnetostriction device according to the present invention is large as compared with the flexural strength of 23.4 MPa of the magnetostriction device made of the magnetostrictive sintered material in which this impregnation phenol resin is not impregnated and cured.

Also, it could be confirmed that the magnetic permeability of the magnetostriction device in which the impregnation phenol resin in which the ferromagnetic material powder was dispersed is impregnated and cured into the holes 10a of the magnetostrictive sintered material 10 is increased approximately 5% as compared with that of the magnetostriction device in which the impregnation phenol resin in which ferromagnetic material was dispersed is not impregnated and cured into the holes 10a of the magnetostrictive sintered material 10.

As described above, according to the embodiments of the present invention, the mechanical strength of the magnetostriction device manufactured by the powder metallurgy method can be improved and the magnetic permeability of the magnetostriction device manufactured by this powder metallurgy method also can be improved.

While the impregnation phenol resin was used as the impregnated composition material in the above-mentioned examples, the present invention is not limited thereto and phenol resin, resin in which an inorganic material such as silica is dispersed into phenol resin, epoxy based resin or acrylic resin can be used as the above-mentioned impregnated composition material.

While iron was used as the ferromagnetic material in the above-mentioned examples, the present invention is not limited thereto and other suitable materials such as permalloy and magnetite can be used as the above-mentioned ferromagnetic material.

According to the present invention, there is provided a magnetostriction device in which an impregnated composition material is impregnated into and caked into holes of a magnetostrictive sintered material manufactured by a powder metallurgy method.

According to the present invention, there is provided a magnetostriction device in which a magnetostrictive sintered material of $Tb_{0.3}Dy_{0.7}Fe_2$ is made of powder ground from $Fe_2Tb$, $Fe_2Dy$ by a powder metallurgy method, an impregnated composition material being impregnated and caked into the holes of the magnetostrictive sintered material.

Further, according to the present invention, there is provided a magnetostriction device, wherein the impregnated composition material is phenol resin or resin, resin in which an inorganic material such as silica is dispersed into phenol resin, epoxy based resin or acrylic resin.

Further, according to the present invention, there is provided a magnetostriction device, wherein the impregnated composition material has a powder-like material with a high magnetic permeability dispersed thereto.

According to the present invention, since the impregnated composition material is impregnated into the holes of the magnetostrictive sintered material, it is possible to improve mechanical strength of the magnetostriction device.

Also, the magnetostriction device according to the present invention has the powder-like material with high magnetic permeability dispersed into the above-mentioned impregnated composition material.

Further, according to the present invention, since the impregnated composition material in which the powder-like material with high magnetic permeability is dispersed is impregnated and caked into the holes of the magnetostrictive sintered material, the mechanical strength of the magnetostriction device can be improved and the magnetic permeability thereof also can be improved.

Furthermore, according to the present invention, the mechanical strength of the magnetostriction device manufactured by the powder metallurgy method can be improved and the magnetic permeability thereof also can be improved.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

The invention claimed is:

1. A magnetostriction device, comprising:
    a magnetostrictive sintered material manufactured by a powder metallurgy method using particles ground in an argon atmosphere to a particle size of approximately 10 μm, the magnetostrictive sintered material having a plurality of holes; and
    an impregnated composition material impregnated into the plurality of holes in the magnetostrictive sintered material,
    in which the impregnated composition material includes ferromagnetic material powder.

2. The magnetostriction device according to claim 1, wherein the impregnated composition material further includes a resin in which an inorganic material is dispersed, wherein the resin is one of a phenol resin, an epoxy based resin, or an acrylic resin.

3. A magnetostriction device, comprising:
    a magnetostrictive sintered material manufactured by a powder metallurgy method using particles ground in an argon atmosphere to a particle size of approximately 10 μm, the magnetostrictive sintered material having a plurality of holes; and
    an impregnated composition material impregnated into the plurality of holes in the magnetostrictive sintered material,
    wherein the impregnated composition material includes a powder-like material with a high magnetic permeability dispersed therein.

4. A magnetostriction device, comprising:
    a magnetostrictive sintered material of $Tb_{0.3}Dy_{0.7}Fe_2$ made of powder ground from $Fe_2Tb$, $Fe_2Dy$ in an argon gas by a powder metallurgy method to a particle size of approximately 10 microns, the magnetostrictive sintered material having a plurality of holes; and
    an impregnated composition material impregnated into the plurality of holes in the magnetostrictive sintered material,
    in which the impregnated composition material includes ferromagnetic material powder.

5. The magnetostriction device according to claim 4, wherein the impregnated composition material further includes a resin in which an inorganic material is dispersed, wherein the resin is one of a phenol resin, an epoxy based resin, or an acrylic resin.

6. A magnetostriction device, comprising:
    a magnetostrictive sintered material of $Tb_{0.3}Dy_{0.7}Fe_2$ made of powder ground from $Fe_2Tb$, $Fe_2Dy$ in an argon gas by a powder metallurgy method to a particle size of approximately 10 microns, the magnetostrictive sintered material having a plurality of holes; and
    an impregnated composition material impregnated into the plurality of holes in the magnetostrictive sintered material,
    wherein the impregnated composition material includes a powder-like material with a high magnetic permeability dispersed therein.

7. The magnetostriction device according to claim 1, wherein the ferromagnetic material powder is iron powder.

8. The magnetostriction device according to claim 4, wherein the ferromagnetic material powder is iron powder.

9. A method for forming a magnetostriction device, comprising:
    forming magnetostrictive sintered material into a predetermined shape having a plurality of holes, in which the magnetostrictive sintered material is manufactured by a powder metallurgy method; and
    impregnating a composition material into the plurality of holes, in which the composition material includes ferromagnetic material.

10. A magnetostriction device, comprising:
    magnetostrictive sintered material formed into a predetermined shape having a plurality of holes, in which the magnetostrictive sintered material is manufactured by a powder metallurgy method; and
    composition material impregnated into the plurality of holes, in which the composition material includes ferromagnetic material.

* * * * *